(12) United States Patent
Nanjyo et al.

(10) Patent No.: US 8,410,887 B2
(45) Date of Patent: Apr. 2, 2013

(54) BUILT-IN-COIL SUBSTRATE

(75) Inventors: Jyunichi Nanjyo, Nagaokakyo (JP);
Hiroki Sakamoto, Nagaokakyo (JP)

(73) Assignee: Murata Manufacturing Co., Ltd.,
Kyoto (JP)

(*) Notice: Subject to any disclaimer, the term of this patent is extended or adjusted under 35 U.S.C. 154(b) by 0 days.

(21) Appl. No.: 13/602,600

(22) Filed: Sep. 4, 2012

(65) Prior Publication Data

US 2012/0326827 A1 Dec. 27, 2012

Related U.S. Application Data

(63) Continuation of application No. PCT/JP2011/053144, filed on Feb. 15, 2011.

(30) Foreign Application Priority Data

Jul. 16, 2010 (JP) ................................. 2010-162305

(51) Int. Cl.
*H01F 5/00* (2006.01)
*H01F 27/30* (2006.01)

(52) U.S. Cl. .......................... 336/200; 336/199; 336/205

(58) Field of Classification Search .................. 336/199, 336/200, 205; 257/531; 438/238, 381
See application file for complete search history.

(56) References Cited

U.S. PATENT DOCUMENTS

| | | | | |
|---|---|---|---|---|
| 6,498,553 B1* | 12/2002 | Tanaka et al. | ............... | 336/83 |
| 6,621,400 B2* | 9/2003 | Horie | ............... | 336/200 |
| 6,683,523 B2* | 1/2004 | Takashima et al. | ........... | 336/200 |
| 7,034,637 B2* | 4/2006 | Kono et al. | ................... | 333/185 |
| 7,161,446 B2* | 1/2007 | Uchida et al. | .................. | 333/185 |
| 7,511,594 B2* | 3/2009 | Sasaki et al. | .................. | 333/132 |
| 7,839,651 B2* | 11/2010 | Nishizawa | .................... | 361/763 |
| 7,940,531 B2* | 5/2011 | Watanabe | ..................... | 361/760 |
| 7,982,573 B2* | 7/2011 | Mori | .............................. | 336/200 |
| 8,188,828 B2* | 5/2012 | Noma et al. | .................. | 336/200 |
| 2002/0140539 A1 | 10/2002 | Takashima et al. | | |
| 2009/0068426 A1 | 3/2009 | Nishizawa | | |
| 2009/0256668 A1 | 10/2009 | Noma et al. | | |

FOREIGN PATENT DOCUMENTS

| | | |
|---|---|---|
| JP | 8-64421 A | 3/1996 |
| JP | 2001-308538 A | 11/2001 |
| JP | 2002-289432 A | 10/2002 |
| JP | 2003-109820 A | 4/2003 |
| JP | 2005-294725 A | 10/2005 |
| JP | 2006-352018 A | 12/2006 |
| JP | 2009-94438 A | 4/2009 |
| WO | 2007/145189 A1 | 12/2007 |
| WO | 2009/081865 A1 | 7/2009 |

OTHER PUBLICATIONS

Official Communication issued in International Patent Application No. PCT/JP2011/053144, mailed on May 24, 2011.

* cited by examiner

*Primary Examiner* — Mohamad Musleh
*Assistant Examiner* — Joselito Baisa
(74) *Attorney, Agent, or Firm* — Keating & Bennett, LLP

(57) ABSTRACT

In a built-in-coil substrate, when viewed in perspective in a stacking direction in which insulating layers of a substrate body are stacked, mutually superposed second coil elements are located further inward than inner peripheries of mutually superposed first coil elements. A cavity is continuous between at least one of the second coil elements and one insulating layer that is in contact with the second coil element(s), and another insulating layer that opposes the second coil element(s) such that the second coil element(s) are exposed, and, when viewed in perspective in the stacking direction, the cavities have annular shapes and extend further inward than the outer peripheries of the mutually superposed first coil elements, there being an interval provided between the cavities and these outer peripheries, and further outward than the inner peripheries of the mutually superposed second coil elements.

6 Claims, 7 Drawing Sheets

BUILT-IN-COIL SUBSTRATE

BACKGROUND OF THE INVENTION

1. Field of the Invention

The present invention relates to built-in-coil substrates and more specifically relates to built-in-coil substrates including a coil built into the inside of the substrate.

2. Description of the Related Art

Module components in which circuit components such as semiconductor integrated circuits, capacitors, and resistors are mounted on a substrate having a built-in coil, manufactured by alternately stacking insulating layers, which contain a ceramic material, and inner conductor layers on top of one another and firing the integrated multilayer body, are used in cellular phones.

Built-in-coil substrates have been proposed in which cavities are provided inside the substrates.

For example, in Japanese Unexamined Patent Application Publication No. 8-64421, it is disclosed that, regarding a multilayer inductor, in a firing process, magnetic layers and inner conductor layers are integrated into a single sintered body, but while cooling to room temperature, residual stress is generated due to the difference in thermal expansion coefficient between the magnetic layers and the inner conductor layers, and consequently magnetostriction is generated and the performance of the multilayer inductor is reduced. Therefore, a cavity for allowing relaxation of stress is formed outside of the outermost layer among the inner conductor layers.

In Japanese Unexamined Patent Application Publication No. 2005-294725, it is disclosed that by using a first conductive paste, which contains resin particles and has a thermal contraction coefficient equal to or greater than that of ceramic green sheets, and a second conductive paste, which has thermal contraction coefficient smaller than that of the ceramic green sheets, cavities are formed as a result of the resin particles being destroyed by firing and thereby stress is reduced.

In Japanese Unexamined Patent Application Publication No. 2006-352018, it is disclosed that, as illustrated in the sectional view of FIG. 9A and the enlarged sectional view of FIG. 9B, in a case where cavities 140 are formed between coil electrodes 130 inside a multilayer body 110 of a multilayer electronic component, the number of cavities 140 is made to be half or more the number of coil electrodes 130 and the ratio between a width a of the cavities 140 in the stacking direction and a distance b between adjacent coil electrodes 130 in the stacking direction is made to be $0 < a/b \leq \frac{1}{2}$. The ratio is made to be $0 < a/b$ in order to realize an effect of stress relaxation and the ratio is made to be $a/b \leq \frac{1}{2}$ in order to realize an effect of preventing cracks.

In International Publication No. 2009/081865, it is disclosed that, by stacking inner coils and outer coils of different sizes, the formation of unevenness on the surface of a multilayer body is suppressed and the occurrence of cracks due to the concentration of stress in magnetic layers on the outermost sides in the stacking direction is suppressed compared with the case where coils having the same diameter are superposed.

A built-in-coil substrate is manufactured by dividing a collective substrate containing portions that will become a plurality of built-in-coil substrates into individual pieces. When cavities are provided inside the collective substrate, fissures occur that originate from the cavities and break defects and cracks are liable to occur when the collective substrate is bent in order to divide the collective substrate into individual pieces.

SUMMARY OF THE INVENTION

In view of such circumstances, preferred embodiments of the present invention provide a built-in-coil substrate in which break defects and cracks are not likely to occur, despite there being cavities formed therein.

A built-in coil substrate according to a preferred embodiment of the present invention includes a substrate body including a plurality of insulating layers, which contain a ceramic material, stacked on top of one another; a plurality of coil elements respectively arranged between the insulating layers of different sets of the insulating layers adjacent to each other, and extending in a substantially circumferential direction around an imaginary central axis, which extends in a stacking direction in which the insulating layers of the substrate body are stacked; an interlayer connection conductor that penetrates through the insulating layer and connects the coil elements to one another; and a cavity formed inside the substrate body. The coil elements include first coil elements that are superposed with one another when viewed in perspective in the stacking direction and second coil elements that are superposed with one another inside the inner periphery of the first coil elements, which are superposed with one another when viewed in perspective in the stacking direction. The cavity is continuous between at least one of the coil elements and one insulating layer that is in contact with the coil element, and another insulating layer that opposes the coil element such that the coil element is exposed, and, when viewed in perspective in the stacking direction, the cavity preferably has an annular shape further inward than the outer peripheries of the mutually superposed first coil elements, with an interval being provided between the cavity and these outer peripheries, and further outward than the inner peripheries of the mutually superposed second coil elements.

In this configuration, when viewed in perspective in the stacking direction, a region in which the first coil elements are superposed with one another and a region in which the second coil elements are superposed with one another adjoin each other or are separated from each other and since they are not superposed with each other, unevenness on the front and back surfaces of the substrate body is significantly reduced and prevented compared with the case where all of the coil elements are superposed with one another when viewed in perspective in the stacking direction. In addition, since residual stress that occurs with firing shrinkage is relaxed by the cavity formed between the coil elements and the insulating layers, the performance of the coil is improved.

According to this configuration, since the cavity is located further inward than the outer peripheries of the first coil elements, which are superposed with each other when viewed in perspective in the stacking direction, an interval being provided between the cavity and these outer peripheries, fissures originating from the cavity are less liable to occur when the collective substrate is bent in order to divide the collective substrate into individual pieces than in the case where a cavity is formed up to the outer periphery or further toward the outside beyond the outer peripheries of the first coil elements, which are superposed with each other when viewed in perspective in the stacking direction. Therefore, break defects and cracks are preventing from occurring despite a cavity having been formed.

Since the cavity is preferably provided not only between a coil element and an insulating layer but also between insulating layers, residual stress is relaxed to a greater degree and the performance of the coil is further improved compared with the case where a cavity is formed only between a coil element and an insulating layer.

In a first preferred embodiment of the present invention, the first coil elements and the second coil elements are alternately arranged in the stacking direction. The cavity is arranged such that a second coil element is exposed and the outer periphery of the cavity extends to a position in the center between mutually opposing first coil elements in the stacking direction. A cavity extending portion is further provided that is continuous with the outer periphery of the cavity and that extends in a region further inward than the outer peripheries of the first coil elements, which are superposed with one another when viewed in perspective in the stacking direction, there being an interval provided between the cavity extending portion and these outer peripheries.

In this case, since tensile stress is generated in the stacking direction in the center in the stacking direction between mutually opposing first coil elements with the occurrence of firing shrinkage, a fissure is generated due to the concentration of stress in the vicinity of the outer periphery of the cavity and a cavity extending portion is formed by the progression of this fissure toward the outer peripheries of the first coil elements which are superposed with one another when viewed in perspective in the stacking direction.

Stress is relaxed with the progression of the fissure and the fissure does not reach the outer peripheries of the first coil elements which are superposed with one another when viewed in perspective in the stacking direction. Consequently, even if the position at which the cavity is located is shifted somewhat with respect to the first coil elements, the cavity extending portion is formed with certainty further inward than the outer peripheries of the first coil elements which are superposed with one another when viewed in perspective in the stacking direction, an interval being provided between the cavity extending portion and these outer peripheries.

Residual stress in the first coil elements, which oppose each other with the cavity extending portion therebetween, is significantly reduced and prevented by formation of the cavity extending portion, and as a result the performance of the coil is improved.

In a second preferred embodiment of the present invention, the first coil elements and the second coil elements are alternately arranged in the stacking direction. The coil elements at both ends in the stacking direction are both first coil elements. One cavity is arranged such that one of the first coil elements is exposed. Another cavity is arranged such that another one of the first coil elements is exposed.

In general, since compressive stress that occurs with firing shrinkage remains in the insulating layers in the vicinity of the front and back surfaces of the substrate body, when stress additionally acts when the collective substrate is bent in order to divide the collective substrate into individual pieces, break defects and cracks are liable to occur. Consequently, when cavities are arranged such that first coil elements at both ends in the stacking direction are exposed, residual stress in the insulating layers in the vicinity of the front and back surfaces of the substrate body is relaxed and therefore the occurrence of break defects and cracks can be significantly reduced and prevented.

In a third preferred embodiment of the present invention, the coil elements further include a third coil element that is further inward than the outer peripheries of the first coil elements, which are superposed with each other when viewed in perspective in the stacking direction, an interval being provided between the third coil element and these outer peripheries, and are superposed with the first coil elements and the second coil elements. The coil elements that are closest to the third coil element in the stacking direction on both sides of the third coil element in the stacking direction are second coil elements. One cavity is arranged such that one of the second coil elements is exposed. Another cavity is arranged such that another one of the second coil elements is exposed.

In this case, residual stress that arises with firing shrinkage around the third coil element and the second coil elements on both sides of third coil element in the stacking direction is relaxed by the cavities and the performance of the coil is improved.

In a fourth preferred embodiment of the present invention, coil elements that are closest to and on both sides of one second coil element in the stacking direction are another two second coil elements. One cavity is arranged such that one of the other two second coil elements is exposed. Another cavity is arranged such that another one of the other two second coil elements is exposed.

In this case, for the three second coil elements that are adjacent to each other in the stacking direction, residual stress that arises with firing shrinkage is relaxed and the performance of the coil is improved.

In each of the above-described configurations, it is preferable that the insulating layers of the substrate body include first and second magnetic layers that contain a magnetic ceramic material, and first to third non-magnetic ferrite layers. The third non-magnetic ferrite layer is arranged between the first and second magnetic layers and adjacent to the first and second magnetic layers. The first magnetic layer is arranged between the first and third non-magnetic ferrite layers and is adjacent to the first and third non-magnetic ferrite layers. The second magnetic layer is arranged between the second and third non-magnetic ferrite layers and is adjacent to the second and third non-magnetic ferrite layers.

In this case, the electrical characteristics can be improved. That is, the direct current superposition characteristics of the coil are improved by the third non-magnetic ferrite layer arranged between the first and second magnetic layers. The first and second non-magnetic ferrite layers arranged on both sides of the first and second magnetic layers in the stacking direction prevent widening of the magnetic field and reduce noise.

According to various preferred embodiments of the present invention, break defects and cracks are prevented from occurring despite the formation of cavities.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to FIGS. 1 to 8.

First Preferred Embodiment

A built-in-coil substrate 10 of a first preferred embodiment will be described while referring to FIGS. 1 to 4 and FIG. 8.

Figure 1:
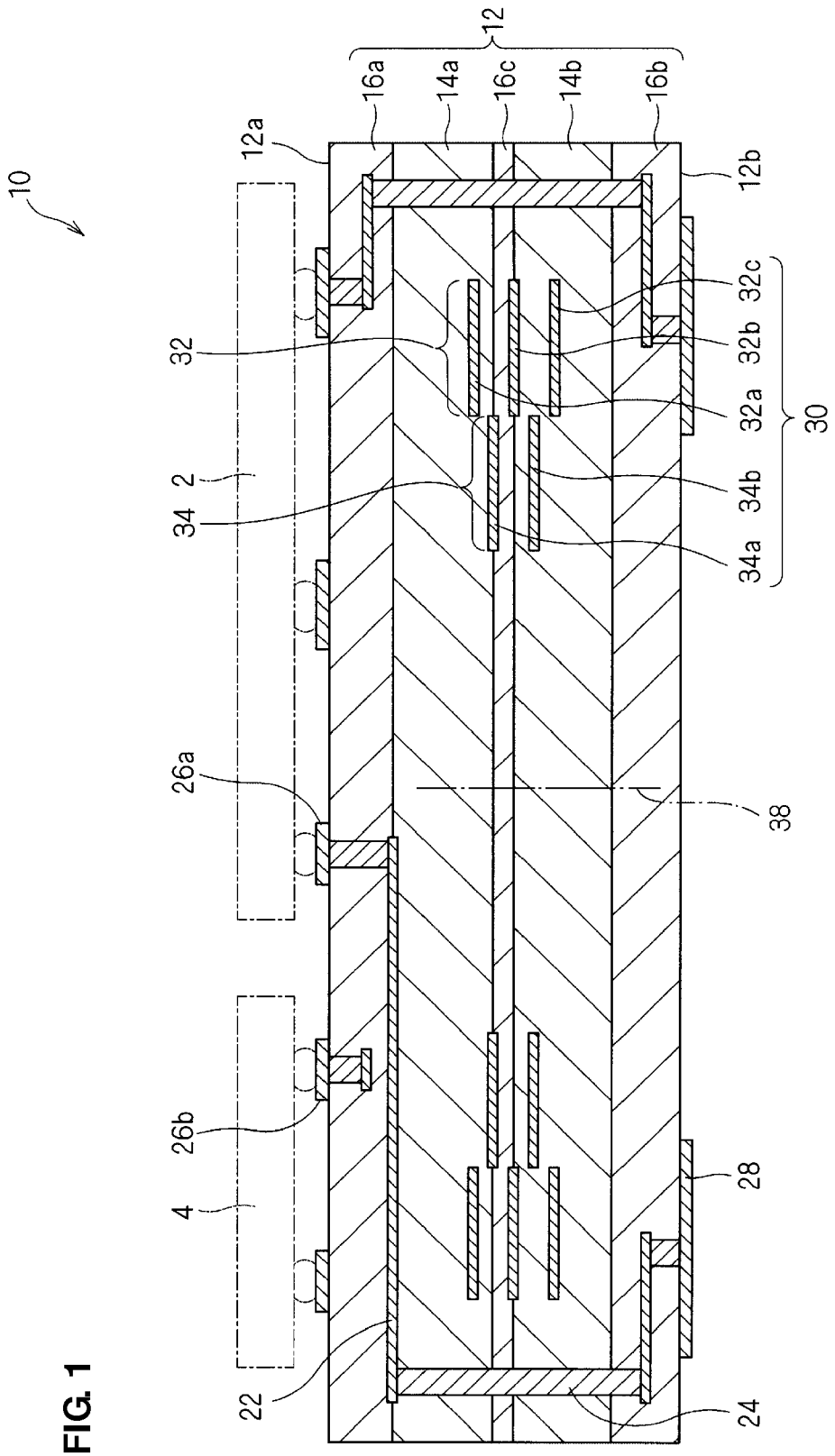
FIG. 1 is a sectional view of a built-in-coil substrate according to a first preferred embodiment of the present invention.

FIG. 1 is a sectional view of the built-in-coil substrate 10.

As illustrated in FIG. 1, in the built-in-coil substrate 10, a coil 30, in-plane wiring conductors 22 and interlayer connection conductors 24 are provided inside a substrate body 12.

The substrate body 12 is preferably formed by stacking a first non-magnetic ferrite layer 16a, a first magnetic layer 14a, an intermediate non-magnetic ferrite layer 16c, which is a third non-magnetic ferrite layer, a second magnetic layer 14b and a second non-magnetic ferrite layer 16b in this order from the top in FIG. 1. The first and second magnetic layers 14a and 14b include a magnetic ceramic material, a magnetic ferrite material having a main constituent of, for example, iron oxide, zinc oxide, nickel oxide or copper oxide, and a ceramic material. The first and second non-magnetic ferrite layers 16a and 16b and the intermediate non-magnetic ferrite layer 16c include a non-magnetic ferrite having a main constituent of, for example, iron oxide, zinc oxide or copper oxide, and a ceramic material. Each of the layers 14a, 14b, 16a, 16b, and 16c of the substrate body 12 preferably is an insulating layer including one layer or two or more stacked layers of ceramic materials.

The coil 30 includes first coil elements 32a to 32c and second coil elements 34a and 34b. The coil elements 32a to 32c and 34a and 34b are provided inside the first and second magnetic layers 14a and 14b and the intermediate non-magnetic ferrite layer 16c.

A configuration can be adopted in which the intermediate non-magnetic ferrite layer 16c is omitted, but when the intermediate non-magnetic ferrite layer 16c is provided between the first and second magnetic layers 14a and 14b, direct current superposition characteristics of the coil 30 are improved compared to the case where the coil elements are formed in just the magnetic layers.

The first and second non-magnetic ferrite layers 16a and 16b suppress widening of the magnetic field and reduce noise.

Land electrodes 26a and 26b for mounting electronic components 2 and 4 are formed on an upper surface 12a of the substrate body 12. Terminal electrodes 28, which are for mounting the built-in-coil substrate 10 onto for example another circuit board, are formed on a lower surface 12b of the substrate body 12. In the case where no components are to be mounted on the upper surface 12a of the substrate body 12, the land electrodes can be omitted.

Figure 2:
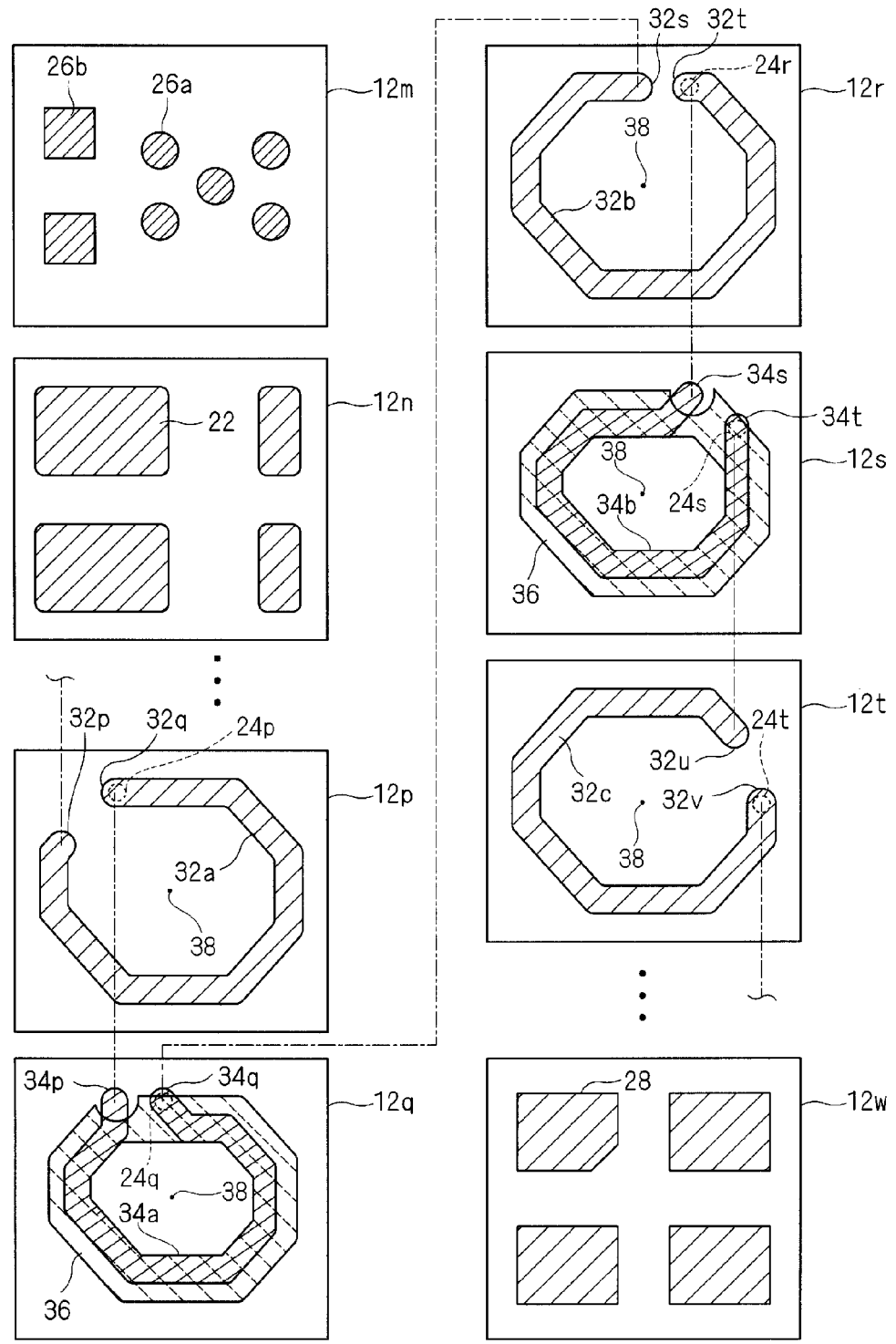
FIG. 2 is an exploded plan view of the built-in-coil substrate according to the first preferred embodiment of the present invention.

FIG. 2 is an exploded plan view of the built-in-coil substrate 10. As illustrated in FIG. 2, in the built-in-coil substrate 10, conductor patterns shaded with solid diagonal lines are provided on insulating layers 12m, 12n, . . . , 12p to 12t, . . . , 12w, which are stacked on top of one another and form the substrate body 12. In addition, interlayer connection conductors 24p to 24t, which penetrate through the insulating layers 12p to 12t, are provided. In FIG. 2, illustration of interlayer connection conductors that penetrate through insulating layers other than the interlayer connection conductors 24p to 24t is omitted.

As illustrated in FIG. 2, the first coil elements 32a to 32c and the second coil elements 34a and 34b are alternately and respectively arranged in the stacking direction between pairs of layers, which are not adjacent to each other in the stacking direction, such that the first coil elements 32a and 32c are at both ends in the stacking direction.

One ends 34p and 34s of the second coil elements 34a and 34b on the insulating layers 12q and 12s and one ends 32q and 32t of the first coil elements 32a and 32b on the insulating layers 12p and 12r are connected to each other via the interlayer connection conductors 24p and 24r, which penetrate through the insulating layers 12p and 12r. Other ends 34q and 34t of the second coil elements 34a and 34b on the insulating layers 12q and 12s and other ends 32s and 32u of the first coil elements 32b and 32c on the insulating layers 12r and 12t are connected to each other via the interlayer connection conductors 24q and 24s, which penetrate through the insulating layers 12q and 12s.

Another end 32p of the first coil element 32a is connected to an in-plane wiring conductor 22 via an interlayer connection conductor, which is not illustrated. Furthermore, one end 32v of the first coil element 32c is connected to a terminal electrode 28 via the interlayer connection conductor 24t, and another interlayer connection conductor and in-plane wiring conductor, which are not illustrated.

As illustrated in FIG. 2, the first coil elements 32a to 32c and the second coil elements 34a and 34b preferably have substantially ring-like shapes or substantially C-like shapes, so as to extend in a substantially circumferential direction around a virtual central axis 38 that extends in the stacking direction (direction perpendicular to the plane of the paper in FIG. 2) which is the direction in which the insulating layers of the substrate body 12 are stacked. The first coil elements 32a to 32c preferably have substantially the same shape, are arranged concentrically, are superposed with one another while being shifted from one another in terms of angle when viewed in perspective in the stacking direction and define a large annular coil region 32 (refer to FIG. 1) having a relatively large outer diameter. The second coil elements 34a and 34b preferably have substantially the same shape, are arranged concentrically, are superposed with one another while being shifted from one another in terms of angle when viewed in perspective in the stacking direction and define a small annular coil region 34 (refer to FIG. 1) having a relatively small outer diameter.

When viewed in perspective in the stacking direction, the second coil elements 34a and 34b are superposed with each other inside an inner periphery of the mutually superposed first coil elements 32a to 32c. That is, when viewed in perspective in the stacking direction, the outer peripheries of the mutually superposed second coil elements 34a and 34b adjoin the inner peripheries of the mutually superposed first coil elements 32a to 32c or an interval is provided between these outer peripheries and the inner peripheries of the mutually superposed first coil elements 32a to 32c. Thus, compared with the case where all of the coil elements are arranged so as to be superposed with one another in the stacking direction, formation of irregularities on the upper surface 12a and the lower surface 12b of the substrate body 12 can be significantly reduced and prevented.

Figure 4:
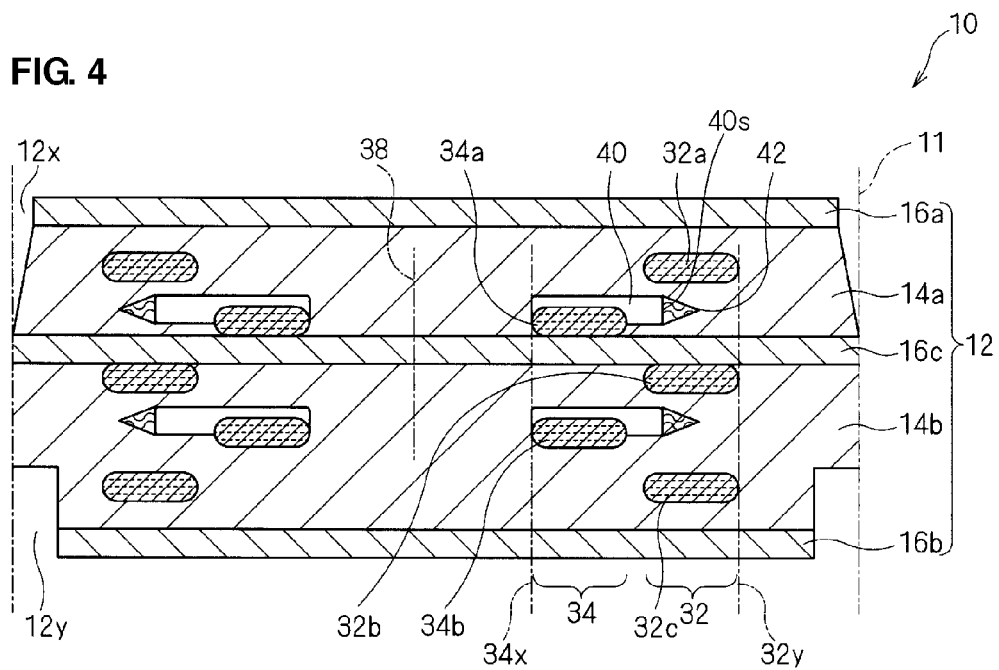
FIG. 4 is a sectional view of the built-in-coil substrate according to the first preferred embodiment of the present invention.

FIG. 4 is a sectional view that schematically illustrates just main structural portions of the built-in-coil substrate 10. As illustrated in FIG. 4, the built-in-coil substrate 10 is an individual unit obtained by cutting a collective substrate that contains portions that will become a plurality of substrate bodies 12 along break grooves 12x and 12y, as indicated by chain lines 11.

Within the substrate body 12, cavities 40 are arranged to extend in an annular shape around the virtual central axis 38 along the second coil elements 34a and 34b when viewed in perspective in the stacking direction. The cavities 40 are continuous between the second coil elements 34a and 34b and one insulating layer that is in contact with the second coil elements 34a and 34b, and another insulating layer that faces the second coil elements 34a and 34b, such that the second coil elements 34a and 34b are exposed. The cavities 40 extend toward the outside from the second coil elements 34a and 34b, which are superposed with each other when viewed in perspective in the stacking direction, and outer peripheries 40s of the cavities 40 extend to an intermediate position in the stacking direction between the first coil elements 32a and 32b, which oppose each other, and between the first coil elements 32b and 32c, which oppose each other.

Residual stress in the second coil elements 34a and 34b is relaxed by the cavities 40 and the performance of the coil is increased. The cavities 40 cross over the second coil elements 34a and 34b and are located between the insulating layers, and therefore the residual stress is more relaxed and the performance of the coil is more improved compared with a case where the cavities are not provided between the insulating layers.

Figure 3:
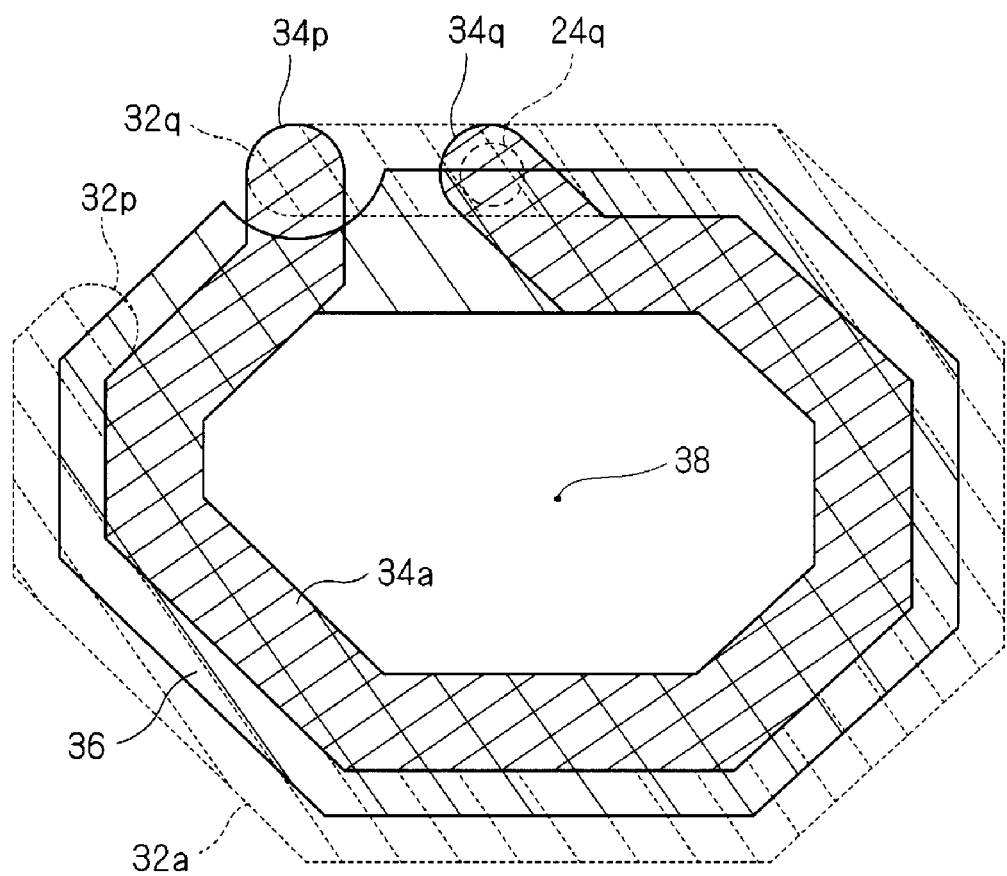
FIG. 3 is an enlarged view of a portion of an intermediate layer of the built-in-coil substrate according to the first preferred embodiment of the present invention.

As illustrated in FIG. 2 and in the enlarged view of essential parts of FIG. 3, by preferably making a cavity forming material 36 such as a carbon paste formed in an annular shape so as to be superposed with the second coil elements 34a and 34b and jut out toward the outside from the second coil elements 34a and 34b disappear at the time of firing, the cavities 40 are formed in this manner, for example. In FIG. 3, a dotted line represents the first coil element 32a viewed in perspective in the stacking direction. The cavity forming material 36 is arranged such that an interval is provided between the cavity forming material 36 and the outer periphery of the first coil element 32a and such that the cavity forming material 36 is superposed with approximately half an area of the first coil element 32a on the inner peripheral side.

In addition, cavity extending portions 42, which are continuous with the outer peripheries 40s of the cavities 40, are provided inside the substrate body 12. The cavity extending portions 42 are provided only within regions between the first coil elements 32a and 32b and between the first coil elements 32b and 32c, which oppose each other. When viewed in perspective in the stacking direction, the cavity extending portions 42 are located further inward than an outer periphery position 32y of the large coil region 32 such that an interval is provided between the cavity extending portions 42 and the outer periphery position 32y, and are not located further outward the outer periphery position 32y.

The cavity extending portions 42, as will be described below, are cavities that appear due to fissures formed at the outer peripheries 40s of the cavities 40 progressing during firing shrinkage.

Figure 8:
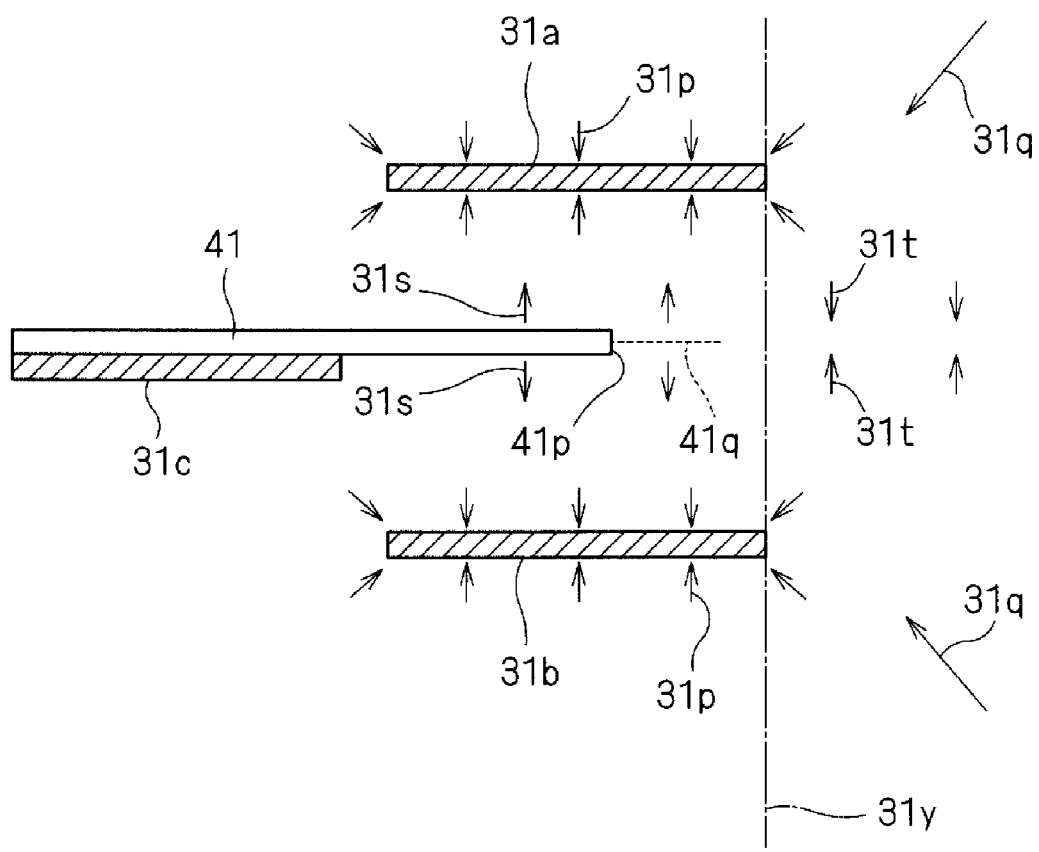
FIG. 8 is a view for explaining the state of stress inside a built-in-coil substrate.
Figure 9A:
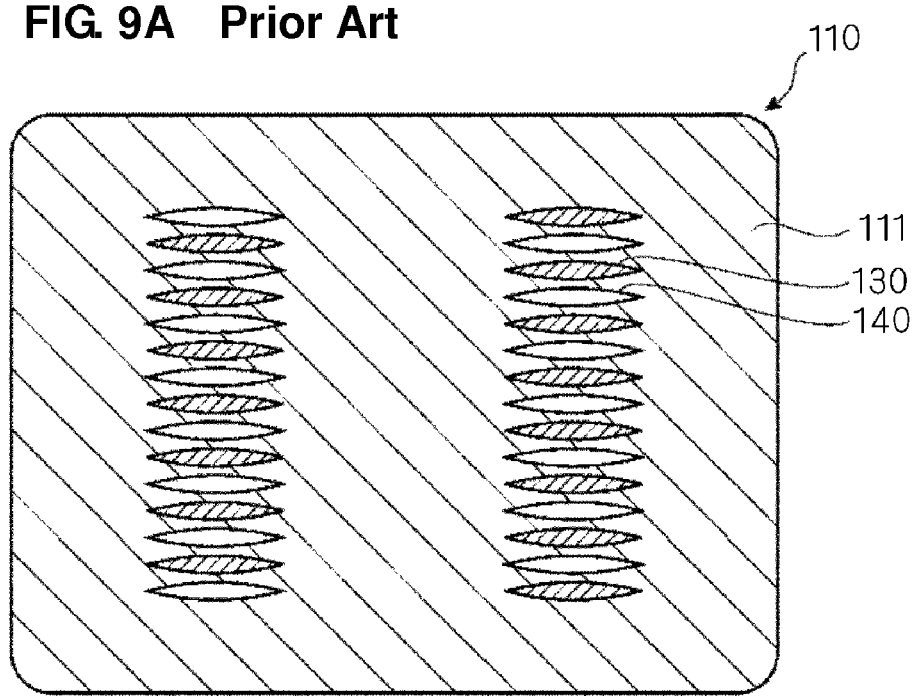
FIG. 9A is a sectional view and FIG. 9B is an enlarged sectional view of a multilayer electronic component according to the related art.
Figure 9B:
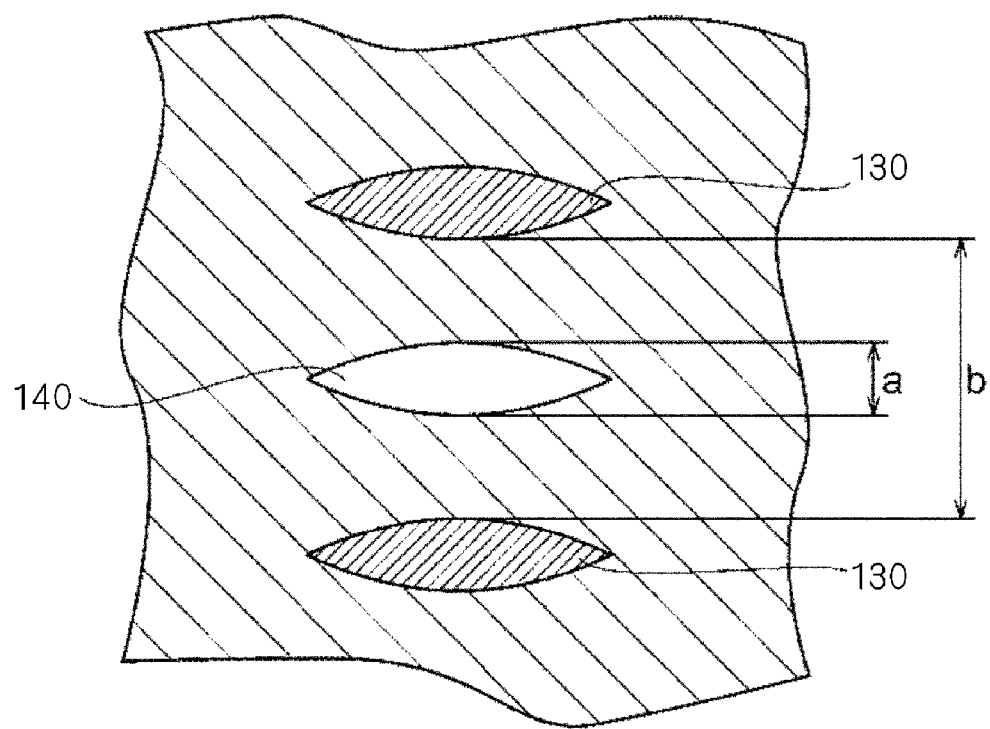

FIG. 8 is a diagram for explaining the state of stress inside the built-in-coil substrate 10 during firing shrinkage. As illustrated in FIG. 8, since the coil elements 31a to 31c, which contain metal materials, have larger coefficients of linear expansion than the insulating layers of the substrate body, which contain ceramic materials, when the temperature decreases to room temperature after sintering, tensile stress acts in the insulating layers at the peripheries of the first coil elements 31a and 31b as indicated by the arrows 31p.

As a result, in the cavity 41 located at a position in the middle in the stacking direction (up-down direction in FIG. 8) between the mutually opposing first coil elements 31a and 31b, due to tensile stresses acting in opposite directions as indicated by the arrows 31s, a fissure is formed that communicates with an outer periphery 41p of the cavity 41 due to concentration of the stress. The tensile stresses indicated by the arrows 31s act in directions in which the fissure widens and therefore the fissure progresses in a direction away from the cavity 41 along a chain line 41q.

As for the tensile stress indicated by the arrows 31s, since the stress is relaxed and becomes smaller with progression of the fissure, progression of the fissure halts short of the outer periphery positions 31y of the first coil elements 31a and 31b, which are superposed with each other when viewed in perspective in the stacking direction.

However, in a region (region to the right of the outer periphery position 31y in FIG. 8) in which there are no coil elements, outside of a region in which the first coil elements 31a and 31b oppose each other when viewed in perspective in the stacking direction, tensile stress is distributed in diagonal directions toward the first coil elements 31a and 31b as indicated by the arrows 31q. The components of these stresses in the stacking direction are compressive stresses as indicated by arrows 31t. Consequently, no fissures are formed in this region.

Therefore, as illustrated in FIG. 4, the cavity extending portions 42 are continuous with the outer peripheries 40s of the cavities 40 and extend in a region further inward than the outer periphery positions 32y of the first coil elements 32a to 32c, which are superposed with one another when viewed in perspective in the stacking direction, such that there is an interval provided between the cavity extending portions 42 and the outer periphery positions 32y.

Even if the positions at which the cavities 40 are formed are somewhat deviated with respect to the first coil elements 32a to 32c, the cavity extending portions 42 are formed with certainty due to the internal stress that occurs during firing shrinkage, such that an interval is provided between the cavity extending portions 42 and the outer periphery positions 32y of the first coil elements 32a to 32c, which are superposed with one another when viewed in perspective in the stacking direction.

Residual stress in the first coil elements 32a to 32c, which oppose each other with the cavity extending portions 42 therebetween, is reduced by the formation of the cavity extending portions 42, and as a result the performance of the coil 30 is improved.

The cavities 40 and the cavity extending portions 42 are arranged further inward than the outer periphery positions 32y of the first coil elements 32a to 32c, which are superposed with one another when viewed in perspective in the stacking direction, such that an interval is provided between themselves and the outer periphery positions 32y, and therefore it is less likely that fissures will occur that originate from the cavities than in the case where cavities are formed up to the outer peripheries or toward the outside beyond the outer peripheries of the first coil elements, which are superposed with each other when viewed in perspective in the stacking direction. Consequently, break defects and cracks are prevented from occurring.

Next, a non-limiting example of a process of manufacturing the built-in-coil substrate 10 in the case where the built-in-coil substrate 10 is manufactured in the form of a collective substrate will be described.

First, in order to form each layer of the substrate body 12 and constraining layers, which are not illustrated, yet-to-be-sintered ceramic green sheets, which include a ceramic material powder and are preferably sheet-shaped, are prepared.

A magnetic ferrite, which has, for example, an iron oxide, zinc oxide, nickel oxide or copper oxide as a main component, is preferably used for the ceramic green sheets for forming the first and second magnetic layers 14a and 14b. A non-magnetic ferrite, which has, for example, an iron oxide, zinc oxide or copper oxide as a main component, is preferably used for the ceramic green sheets for forming the first and second non-magnetic ferrite layers 16a and 16b and the intermediate non-magnetic ferrite layer 16c.

As illustrated in FIG. 2, the interlayer connection conductors 24p to 24t are formed by creating through holes at appropriate positions in each of the layers 12p to 12t of the ceramic green sheets using for example laser processing or punching processing and filling these through holes with a conductive paste by printing or the like.

In addition, conductor patterns of the coil elements 32a to 32c, and 34a and 34b, in-plane wiring conductors 22, land electrodes 26a and 26b, and terminal electrodes 28, which are shaded with solid diagonal lines, are formed by, for example, printing a conductive paste by performing screen printing or gravure printing on or by transferring pieces of metal foil having predetermined pattern shapes onto one main surface of each of the layers 12m, 12n, 12p to 12t and 12w of the ceramic green sheets.

In addition, regarding each of the layers 12q and 12s of the ceramic green sheets that will form the second coil elements 34a and 34b, the cavity forming material 36 having an annular shape, which is shaded with diagonal broken lines, is formed so as to be superposed with the second coil elements 34a and 34b by printing carbon paste.

Shrinkage controlling green sheets to be used in constraining layers are yet-to-be-sintered green sheets that are sheet-shaped. The shrinkage restraining green sheets contain a non-organic material powder such as alumina that sinters at a temperature higher than the firing temperature of the ceramic green sheets for forming each of the layers of the substrate body 12 and substantially does not sinter at the firing temperature of the ceramic green sheets for forming each of the layers of the substrate body 12.

Next, a composite multilayer body is manufactured by forming a multilayer body by stacking the yet-to-be-sintered ceramic green sheets that will form each of the layers of the substrate body 12 on top of one another and arranging constraining layers that include shrinkage restraining green sheets on both sides of the multilayer body in the stacking direction. A comparatively small pressure is applied in the stacking direction and each of the layers of the multilayer body and the constraining layers are provisionally press bonded to one another.

The composite multilayer body may be manufactured by stacking and provisionally press bonding the shrinkage restraining green sheets onto the multilayer body after manufacturing a provisionally press bonded multilayer body, or may be manufactured by stacking the ceramic green sheets that will become the individual layers of the substrate body 12 and the shrinkage restraining green sheets, and then provisionally press bonding them together in one go.

The constraining layers may be formed by applying slurry for manufacturing the shrinkage restraining green sheets by using screen printing onto a multilayer body obtained by stacking the yet-to-be-sintered ceramic green sheets that will form each of the layers of the substrate body 12. Alternatively, the constraining layers may be formed by forming the shrinkage restraining green sheets on a support and then transferring these shrinkage restraining green sheets onto the multilayer body obtained by stacking yet-to-be-sintered ceramic green sheets that will form each of the layers of the substrate body 12 on top of one another.

Next, the constraining layers are permanently press bonded to the multilayer body by applying a comparatively large pressure to the composite multilayer body.

Next, the composite multilayer body obtained by permanently press bonding the constraining layers to the multilayer body is fired. The firing is performed using conditions under which the ceramic material powder included in the ceramic green sheets that will form each of the layers of the multilayer body that will become the substrate body 12 sinters and under which the non-organic material powder included in the shrinkage restraining green sheets of the constraining layers does not sinter. That is, firing is performed at a temperature higher than the sintering temperature of the ceramic green sheets that will form each of the layers of the multilayer body that will become the substrate body 12 and lower than the sintering temperature of the shrinkage restraining green sheets of the constraining layers.

Next, after firing, the constraining layers are removed from the composite multilayer body, such that the fired multilayer body, that is, a collective substrate of built-in-coil substrates 10 is obtained and the break grooves 12x and 12y are formed by laser processing or dicing processing. As needed, plating is performed on the land electrodes 26a and 26b formed on the upper surface 12a of the substrate body 12 and on the terminal electrodes 28 formed on the lower surface 12b of the substrate body 12.

After mounting the electronic components 2 and 4, such as surface mount devices and IC chips, on the land electrodes 26a and 26b of the collective substrate of the built-in-coil substrates 10 completed through the above-described processes, the collective substrate of the built-in-coil substrates 10 is cut along the break grooves 12x and 12y and divided into individual pieces.

Second Preferred Embodiment

A built-in-coil substrate 10a according to a second preferred embodiment will be described with reference to FIG. 5.

The built-in-coil substrate 10a of the second preferred embodiment is preferably formed in substantially the same manner as the built-in-coil substrate 10 of the first preferred embodiment. Hereafter, the same reference symbols will be used for constituent elements common to the first preferred embodiment and description will focus on points that are different from the first preferred embodiment.

Figure 5:
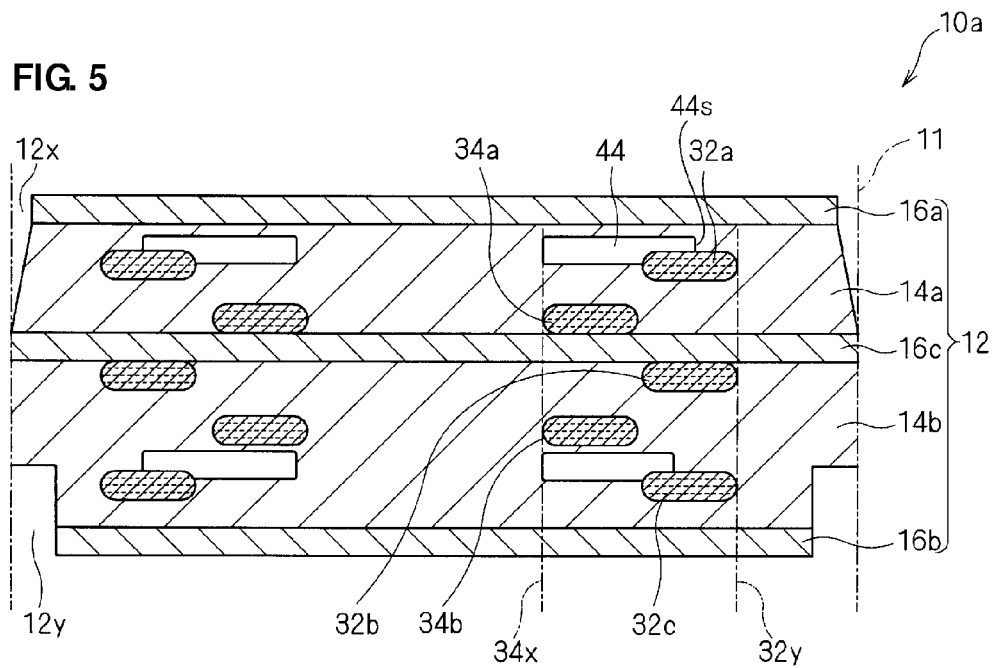
FIG. 5 is a sectional view of a built-in-coil substrate according to a second preferred embodiment of the present invention.

FIG. 5 is a sectional view that schematically illustrates only main constituent elements of the built-in-coil substrate 10a of the second preferred embodiment. As illustrated in FIG. 5, similarly to as in the first preferred embodiment, the first coil elements 32a to 32c and the second coil elements 34a and 34b are arranged inside the substrate body 12 that is preferably formed by stacking the first non-magnetic ferrite layer 16a, the first magnetic layer 14a, the intermediate non-magnetic ferrite layer 16c, the second magnetic layer 14b and the second non-magnetic ferrite layer 16b in order.

The built-in-coil substrate 10a of the second preferred embodiment differs from that of the first preferred embodiment in that cavities 44 are formed such that, among the coil elements 32a to 32c and 34a and 34b located inside the substrate body 12, the first coil elements 32a and 32c formed at both ends in the stacking direction are exposed.

When viewed in perspective in the stacking direction, outer peripheries 44s of the cavities 44 extend to a position in the middle of the first coil elements 32a and 32c, that is, further inward than the outer periphery positions 32y of the first coil elements 32a to 32c, an interval being provided between the outer peripheries 44s and the outer periphery positions 32y. The cavities 44 preferably have an annular shape extending further outward than inner periphery positions 34x of the second coil elements 34a and 34b.

Residual stress in the first coil elements 32a and 32c is relaxed by the cavities 44 and the performance of the coil is increased. The cavities 44 cross over the first coil element 32a and 32c and are located between the insulating layers, and therefore the residual stress is more relaxed and the performance of the coil is more improved than in the case where the cavities are not formed between the insulating layers.

The cavities 44 are not formed between mutually opposing coil elements and therefore, different compared to the first preferred embodiment, cavity extending portions that are continuous with the cavities 44 are not formed.

In general, since compressive stress that occurs with firing shrinkage remains in the insulating layers in the vicinity of the upper surface 12a and the lower surface 12b of the substrate body 12, when stress further acts when the collective substrate is bent in order to divide the collective substrate into individual pieces, break defects and cracks are liable to occur.

Accordingly, when the cavities 44 are formed so as to be in contact with the first coil elements 32a and 32c at both ends in the stacking direction as in the second preferred embodiment, residual stress in the insulating layers in the vicinity of the upper surface 12a and the lower surface 12b of the substrate body 12 is relaxed and therefore the occurrence of break defects and cracks can be significantly reduced and prevented.

The cavities 44, when viewed in perspective in the stacking direction, are located further inward than and spaced apart from the outer periphery positions 32y of the mutually superposed first coil elements 32a to 32c, and therefore, compared with the case where cavities are formed up to the outer periphery positions 32y or toward the outside so as to cross beyond the outer periphery positions 32y of the mutually superposed first coil elements 32a to 32c when viewed in perspective in the stacking direction, fissures that originate from a cavity are less liable to occur when dividing the collective substrate into individual built-in-coil substrates. Therefore, break defects and cracks are less liable to occur.

Third Preferred Embodiment

A built-in-coil substrate 10b according to a third preferred embodiment will be described with reference to FIG. 6.

Figure 6:
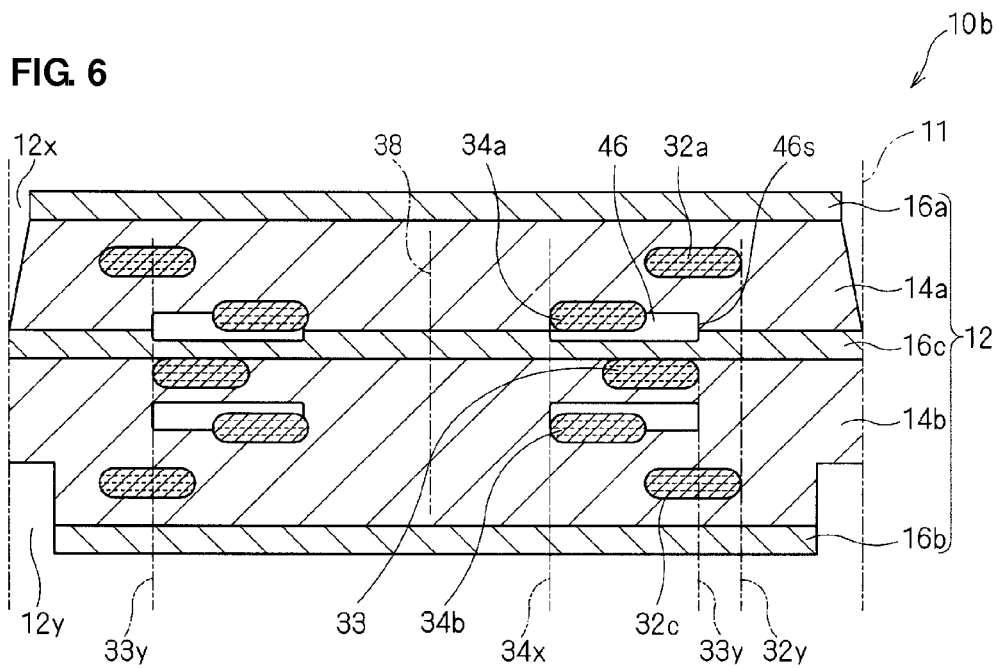
FIG. 6 is a sectional view of a built-in-coil substrate according to a third preferred embodiment of the present invention.

FIG. 6 is a sectional view that schematically illustrates only main constituent elements of the built-in-coil substrate 10b of the third preferred embodiment. As illustrated in FIG. 6, similarly to the first preferred embodiment, the first coil elements 32a and 32c and the second coil elements 34a and 34b are arranged inside the substrate body 12 preferably formed by stacking the first non-magnetic ferrite layer 16a, the first magnetic layer 14a, the intermediate non-magnetic ferrite layer 16c, the second magnetic layer 14b and the second non-magnetic ferrite layer 16b in order.

In the built-in-coil substrate 10b of the third preferred embodiment, a third coil element 33 is provided inside the substrate body 12 instead of the first coil element 32b of the first preferred embodiment. When viewed in perspective in the stacking direction, the third coil element 33 is arranged so as to extend around the virtual central axis 38 in a substantially circumferential direction in a region further inward than the outer periphery positions 32y of the first coil elements 32a and 32c, an interval being provided between the third coil element 33 and these outer periphery positions 32y, and further outward than the inner periphery positions 34x of the second coil elements 34a and 34b. When viewed in perspective in the stacking direction, the third coil element 33 is superposed with the first coil elements 32a and 32c and the second coil elements 34a and 34b.

Similarly to as in the first preferred embodiment, cavities 46 are disposed inside the substrate body 12 such that the second coil elements 34a and 34b are exposed.

Residual tensile stress in the third coil element 33 and the second coil elements 34a and 34b is relaxed by the cavities 46 and therefore the performance of the coil is improved. The cavities 46 cross over the second coil elements 34a and 34b and are located between the insulating layers, and therefore the residual stress is more relaxed and the performance of the coil is more improved than in the case where the cavities are not formed between the insulating layers.

Outer peripheries 46s of the cavities 46 extend within a region in which the first coil elements 32a and 32c oppose each other. Because tensile stress that arises with firing shrinkage in this region is smaller than the tensile stress in the region between the first coil elements 32a and 32b and the region between the first coil elements 32b and 32c where the distance is smaller in the first preferred embodiment, and concentration of stress in the vicinity of the outer peripheries 46s of the cavities 46 is small, fissures that are continuous with the outer peripheries 46s of the cavities 46 do not occur. Consequently, differently from in the first preferred embodiment, cavity extending portions that are continuous with the cavities 46 are not formed.

The cavities 46 are located further inward than the outer periphery positions 32y of the first coil elements 32a and 32c, which are superposed with each other when viewed in perspective in the stacking direction, with an interval being provided between the cavities 46 and these outer periphery positions 32y, and therefore, compared with the case where the cavities are formed up to the outer periphery positions 32y or toward the outside so as to cross beyond the outer periphery positions 32y of the first coil elements 32a to 32c, which are superposed with each other when viewed in perspective in the stacking direction, fissures that originate from a cavity are less likely to occur when dividing the collective substrate into individual built-in-coil substrates. Therefore, break defects and cracks are prevented from occurring.

Fourth Preferred Embodiment

A built-in-coil substrate 10c according to a fourth preferred embodiment will be described with reference to FIG. 7.

Figure 7:
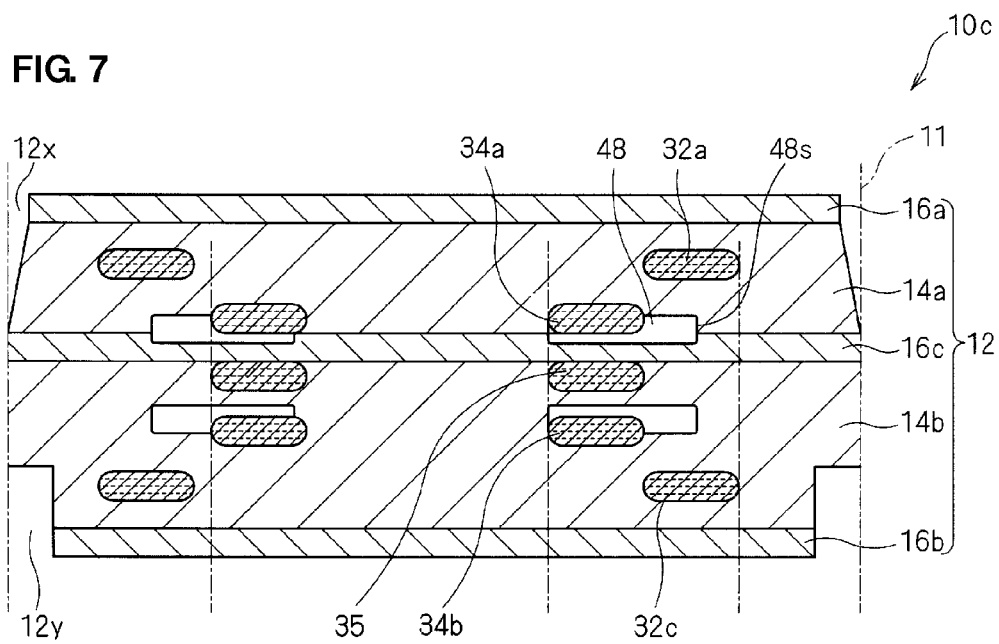
FIG. 7 is a sectional view of a built-in-coil substrate according to a fourth preferred embodiment of the present invention.

FIG. 7 is a sectional view that schematically illustrates only main constituent elements of the built-in-coil substrate 10c of the fourth preferred embodiment. As illustrated in FIG. 7, similarly to the first preferred embodiment, the first coil elements 32a and 32c and the second coil elements 34a and 34b are arranged inside the substrate body 12 preferably formed by stacking the first non-magnetic ferrite layer 16a, the first magnetic layer 14a, the intermediate non-magnetic ferrite layer 16c, the second magnetic layer 14b and the second non-magnetic ferrite layer 16b in order.

In the built-in-coil substrate 10c of the fourth preferred embodiment, a second coil element 35 is provided inside the substrate body 12 instead of the first coil element 32b of the first preferred embodiment. The second coil elements 34a, 34b and 35 are superposed with one another when viewed in perspective in the stacking direction and the positions of their outer peripheries and inner peripheries are the same.

Similarly to the first preferred embodiment, cavities 48 are arranged such that the second coil elements 34a and 34b are exposed.

Residual stress in the second coil elements 34a, 34b and 35 is relaxed by the cavities 48 and the performance of the coil is improved. The cavities 48 cross over the second coil elements 34a and 34b and are located between the insulating layers, and therefore the residual stress is more relaxed and the performance of the coil is more improved than in the case where the cavities are not located between the insulating layers.

Outer peripheries 48s of the cavities 48 extend within a region in which the first coil elements 32a and 32c oppose each other. Because tensile stress that arises with firing shrinkage in this region is smaller than the tensile stress in a region between the first coil elements 32a and 32b and a region between the first coil elements 32b and 32c where the distance is smaller in the first preferred embodiment, and concentration of stress in the vicinity of the outer peripheries 48s of the cavities 48 is small, fissures that are continuous with the outer peripheries 48s of the cavities 48 do not occur. Consequently, differently from the first preferred embodiment, cavity extending portions that are continuous with the cavities 48 are not formed.

The cavities 48 are located further inward than the outer periphery positions 32y of the first coil elements 32a and 32c, which are superposed with each other when viewed in perspective in the stacking direction, an interval being provided between the cavities 48 and these outer periphery positions 32y. Consequently, compared with a case in which the cavities are formed up to the outer periphery positions 32y or toward the outside so as to cross beyond the outer periphery positions 32y of the first coil elements 32a and 32c, which are superposed with each other when viewed in perspective in the stacking direction, fissures that originate from the cavities are less likely to occur when the collective substrate is divided into individual built-in-coil substrates. Therefore, break defects and cracks are prevented from occurring.

As has been described above, when cavities are located further inward than outer peripheries of the first coil elements, which are superposed with one another when viewed in perspective in the stacking direction, an interval being provided between the cavities and these outer peripheries, break defects and cracks are less likely to occur.

The present invention is not limited to the above-described preferred embodiments and can be modified in various ways.

For example, the number of coil elements and the number of cavities may be more than or less than the numbers in the above-described preferred embodiments. Not limited to two or three types of coil elements, there may be four or more types of coil elements. The coil elements can be arranged in any order in the stacking direction. In addition, a configuration may be adopted in which the coil elements are respectively arranged around two or more virtual central axes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A built-in-coil substrate comprising:
   a substrate body including a plurality of ceramic insulating layers stacked on top of one another;
   a plurality of coil elements respectively arranged between sets of insulating layers, which are not mutually adjacent insulating layers, and so as to extend in a substantially circumferential direction around an imaginary central axis that extends in a stacking direction in which the insulating layers of the substrate body are stacked;
   an interlayer connection conductor that penetrates through the insulating layers and connects the coil elements to one another; and
   a cavity disposed inside of the substrate body; wherein
   the coil elements include first coil elements that are superposed with one another when viewed in perspective in the stacking direction, and second coil elements that are superposed with one another inside the inner periphery of the first coil elements, which are superposed with one another when viewed in perspective in the stacking direction;
   the cavity is continuous between at least one of the coil elements and one of the insulating layers that is in contact with the coil element, and another one of the insulating layers that opposes the coil element, such that the coil element is exposed; and
   the cavity has an annular shape and extends further inward than outer peripheries of the first coil elements, which are superposed with each other when viewed in perspective in the stacking direction, an interval being provided between the cavity and the outer peripheries, and further outward than the inner peripheries of the second coil elements, which are superposed with each other.

2. The built-in coil substrate according to claim 1, wherein
   the first coil elements and the second coil elements are arranged alternately in the stacking direction,
   the cavity is arranged such that a second coil element is exposed and the outer periphery of the cavity extends to a center position in the stacking direction between mutually opposing first coil elements; and
   a cavity extending portion is provided in the substrate body, the cavity extending portion being continuous with the outer periphery of the cavity and extending in a region further inward than the outer peripheries of the first coil elements, which are superposed with each other when viewed in perspective, there being an interval provided between the cavity extending portion and the outer peripheries.

3. The built-in-coil substrate according to claim 1, wherein
   the first coil elements and the second coil elements are arranged alternately in the stacking direction,
   coil elements at both ends in the stacking direction are first coil elements; and
   one cavity is arranged such that one of the first coil elements is exposed and another cavity is arranged such that another one of the first coil elements is exposed.

4. The built-in-coil substrate according to claim 1, wherein
   the coil elements further include a third coil element that extends further inward than the outer peripheries of the first coil elements, which are superposed with each other when viewed in perspective in the stacking direction, with an interval being provided between the third coil element and these outer peripheries, and are superposed with the first coil elements and the second coil elements;

the coil elements that are closest to the third coil element in the stacking direction on both sides of the third coil element in the stacking direction are second coil elements;

one cavity is arranged such that one of the second coil elements is exposed; and another cavity is arranged such that another one of the second coil elements is exposed.

5. The built-in-coil substrate according to claim 1, wherein the coil elements that are closest to and on both sides of one of the second coil elements in the stacking direction are another two of the second coil elements;

one cavity is arranged such that one of the other two second coil elements is exposed; and another cavity is arranged such that another of the other two second coil elements is exposed.

6. The built-in-coil substrate according to claim 1, wherein the insulating layers of the substrate body include first and second magnetic layers that contain a magnetic ceramic material, and first to third non-magnetic ferrite layers;

a third non-magnetic ferrite layer is arranged between the first and second magnetic layers and adjacent to the first and second magnetic layers;

the first magnetic layer is arranged between the first and third non-magnetic ferrite layers and adjacent to the first and third non-magnetic ferrite layers; and the second magnetic layer is arranged between the second and third non-magnetic ferrite layers and adjacent to the second and third non-magnetic ferrite layers.

* * * * *